(12) United States Patent
Lin et al.

(10) Patent No.: US 8,003,281 B2
(45) Date of Patent: Aug. 23, 2011

(54) HYBRID MULTI-LAYER MASK

(75) Inventors: Feng-Lung Lin, Baoshan Shiang (TW);
Kuan-Liang Wu, Taipei (TW);
Che-Rong Liang, Taipei (TW); Fei-Gwo Tsai, Tainan (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 181 days.

(21) Appl. No.: 12/250,338

(22) Filed: Oct. 13, 2008

(65) Prior Publication Data

US 2010/0047698 A1  Feb. 25, 2010

Related U.S. Application Data

(60) Provisional application No. 61/090,962, filed on Aug. 22, 2008.

(51) Int. Cl.
*G03F 1/00* (2006.01)
(52) U.S. Cl. ............................................. 430/5; 430/394
(58) Field of Classification Search ................ 430/5, 22, 430/394; 355/53, 72; 356/399; 324/699
See application file for complete search history.

(56) References Cited

U.S. PATENT DOCUMENTS

| 4,849,313 | A | * | 7/1989 | Chapman et al. ................. 430/5 |
| 5,995,200 | A | | 11/1999 | Pierrat |
| 6,710,851 | B1 | * | 3/2004 | Elmer et al. ..................... 355/53 |
| 6,737,205 | B2 | * | 5/2004 | Maltabes et al. ................ 430/22 |
| 2005/0095509 | A1 | * | 5/2005 | Zhang et al. ....................... 430/5 |

OTHER PUBLICATIONS

Chinese Patent Office, Office Action dated Oct. 14, 2010, Application No. 200910166148.1, 4 pages.

* cited by examiner

*Primary Examiner* — Mark F Huff
*Assistant Examiner* — Stewart A Fraser
(74) *Attorney, Agent, or Firm* — Haynes and Boone, LLP

(57) ABSTRACT

A hybrid mask set for exposing a plurality of layers on a semiconductor substrate to create an integrated circuit device is disclosed. The hybrid mask set includes a first group of one or more multi-layer masks (MLMs) for a first subset of the plurality of layers. Each MLM includes a plurality of different images for different layers, the images being separated by a relatively wide image spacer. The hybrid mask set also includes a first group of one or more production-ready masks for a second subset of the plurality of layers. Each production-ready mask includes a plurality of similar images for a common layer, each image being separated by a relatively narrow scribe street.

12 Claims, 6 Drawing Sheets

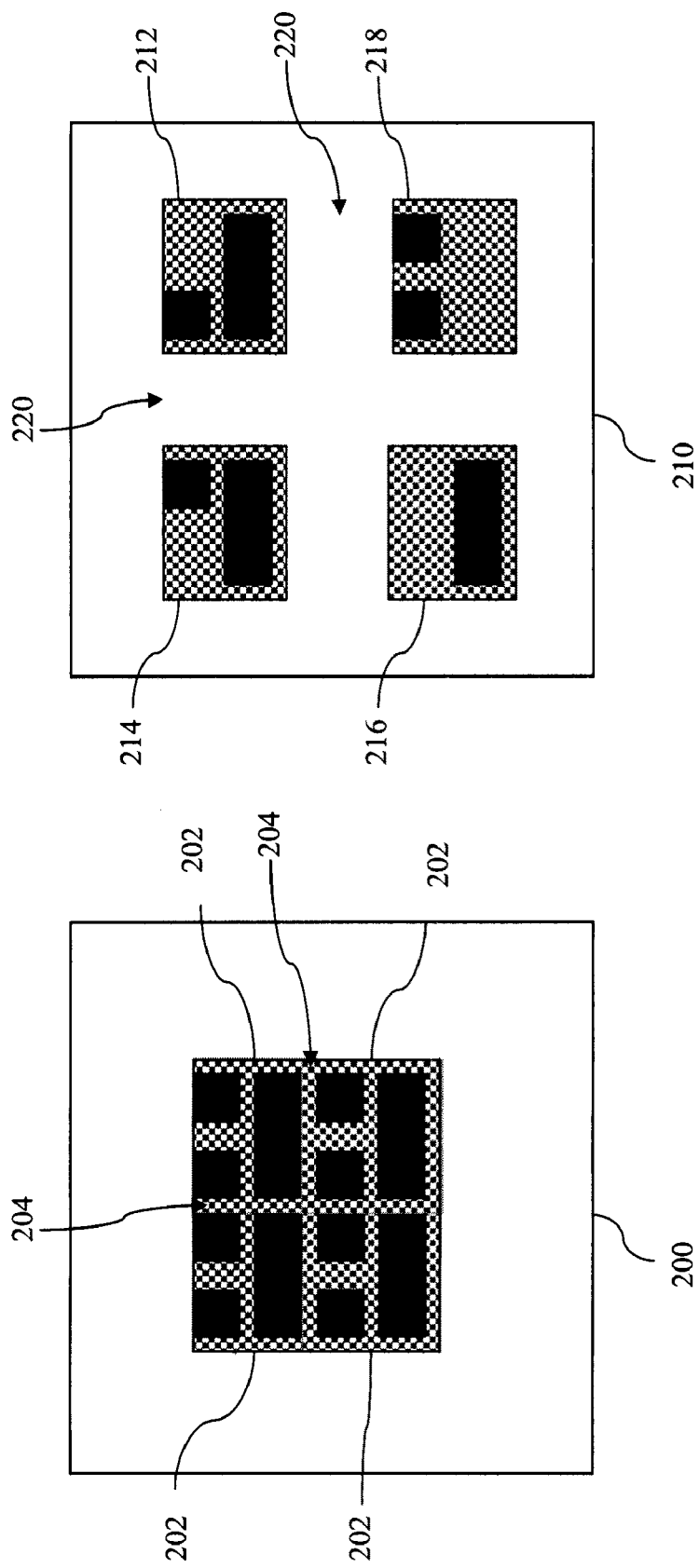

US 8,003,281 B2

HYBRID MULTI-LAYER MASK

PRIORITY DATA

This application claims priority to Provisional Application Ser. No. 61/090,962, filed on Aug. 22, 2008, entitled "HYBRID MULTI-LAYER MASK," the entire disclosure of which is incorporated herein by reference.

BACKGROUND

The fabrication of integrated circuit devices typically requires a series of masks by which images can be projected to pattern a substrate. Due to the increasing complexity of integrated circuit designs, as well as the shrinking geometries of the resulting circuit, it is often desirable to perform a pilot production for verification before full-scale production is initiated. It is desired to facilitate pilot production in a manner that reduces costs and materials, and provides a relatively quick time to full-volume production.

In full-volume production, a single mask (in the present disclosure, the terms mask, photomask, and reticle are used to refer to the same item) is used to produce multiple instances of an image, such as for multiple instances of the same layer on multiple die. In this way, multiple die can be exposed at the same time. One common procedure used in pilot production is to use multi-layer masks (MLMs). In an MLM, instead of multiple instances of the same image, a single mask will have different images corresponding to different layers. With MLM, a first layer is exposed by one image, the MLM is moved relative to the substrate, and a second layer is then exposed. For the sake of example, and not intended to be limiting, a mask can include four images for exposing four die images of a common layer at once. A multi-layer mask (MLM) will have four images, one for each of four different layers on the chip. While throughput is reduced using a MLM (in the above example, only one die image is produced at a time), the reduction in cost of producing one reticle instead of four can be very beneficial.

MLMs are shown in prior art U.S. Pat. Nos. 6,710,851 and 5,995,200, both of which are hereby incorporated by reference. Both of these patents describe multiple images on a single reticle, with the images separated by perimeter borders and interstitial borders. However, these MLMs cannot be used in full-volume production. It is desired to improve on the MLMs shown in these prior art patents.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-6 illustrate various masks that can be used by the lithography system of FIG. 1 according to one or more embodiments of the present invention.

DETAILED DESCRIPTION

Figure 1:
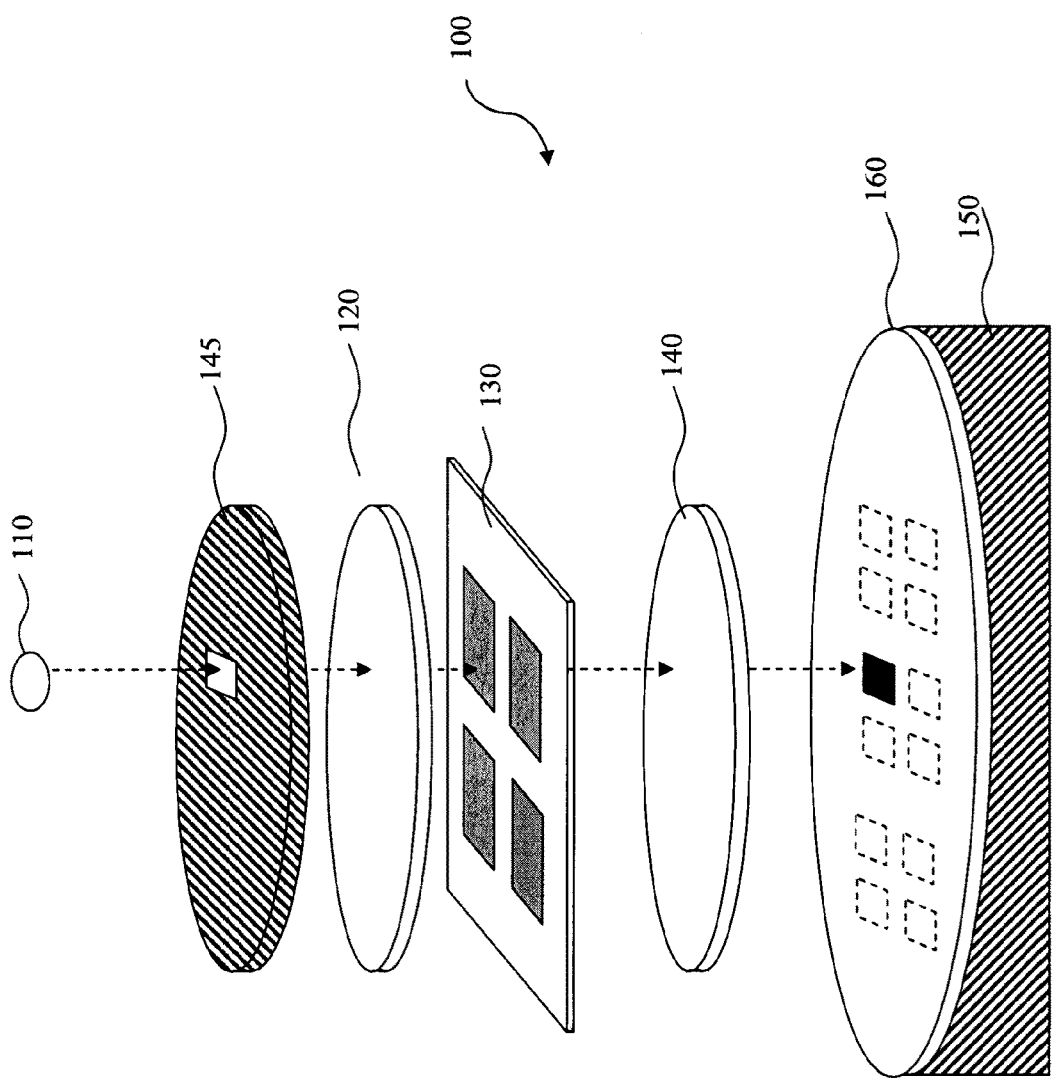
FIG. 1 illustrates an exemplary embodiment of a lithography system according to one or more embodiments of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation or placement of a first feature over or on a second feature in the description that follows may include embodiments in which the first and second features are formed in direct contact, and may also include embodiments in which additional features may be formed interposing the first and second features, such that the first and second features may not be in direct contact, or may include different arrangements of the features.

Referring to FIG. 1, in one embodiment, a lithography system 100 includes a radiation source (or sources) 110. The radiation source 110 may be any suitable light source. For example, the source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). The radiation source 110 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography system 100 includes an illumination system (e.g., a condenser) 120. The illumination system 120 may comprise a single lens or a lens system having multiple lenses and/or other lens components. For example, the illumination system 120 may include microlens arrays, shadow masks, and/or other structures designed to aid in directing light from the light source 110 onto a mask.

During a lithography patterning process, a mask (also referred to as a photomask or a reticle) 130 is provided to the lithography system 100. The mask 130 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

The lithography system 100 includes an objective lens 140. The objective lens 140 may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. The illumination lens 120 and the objective lens 140 are collectively referred to as an imaging lens. The imaging lens may further include additional components such as an entrance pupil and an exit pupil to form an image defined in the mask 130 on a substrate to be patterned.

The lithography system 100 includes an aperture 145 to transmit radiation energy from the radiation source 110. The aperture 145 may be positioned in various locations between the radiation source 110 and a substrate.

The lithography system 100 may further include a substrate stage 150 capable of securing and moving a substrate in translational and rotational modes such that the substrate may be aligned with the mask 130. In the present example, a semiconductor wafer substrate 160 is placed on the substrate stage 150 for being exposed in a lithography process. The substrate 160 may comprise an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 160 may also have a photoresist coating layer formed thereon during the lithography process.

It is understood that there are various arrangements of the lithography system 100 that may also be used. For example, the aperture 145 may be configured between the mask 130 and the objective lens 140. Also, the lithography system may also include components and mechanism to implement an immersion lithography process. Furthermore, it is understood that the presently described process works with many different types of lithography systems, including scanner, stepper, and step-and-scan systems.

Figure 2:
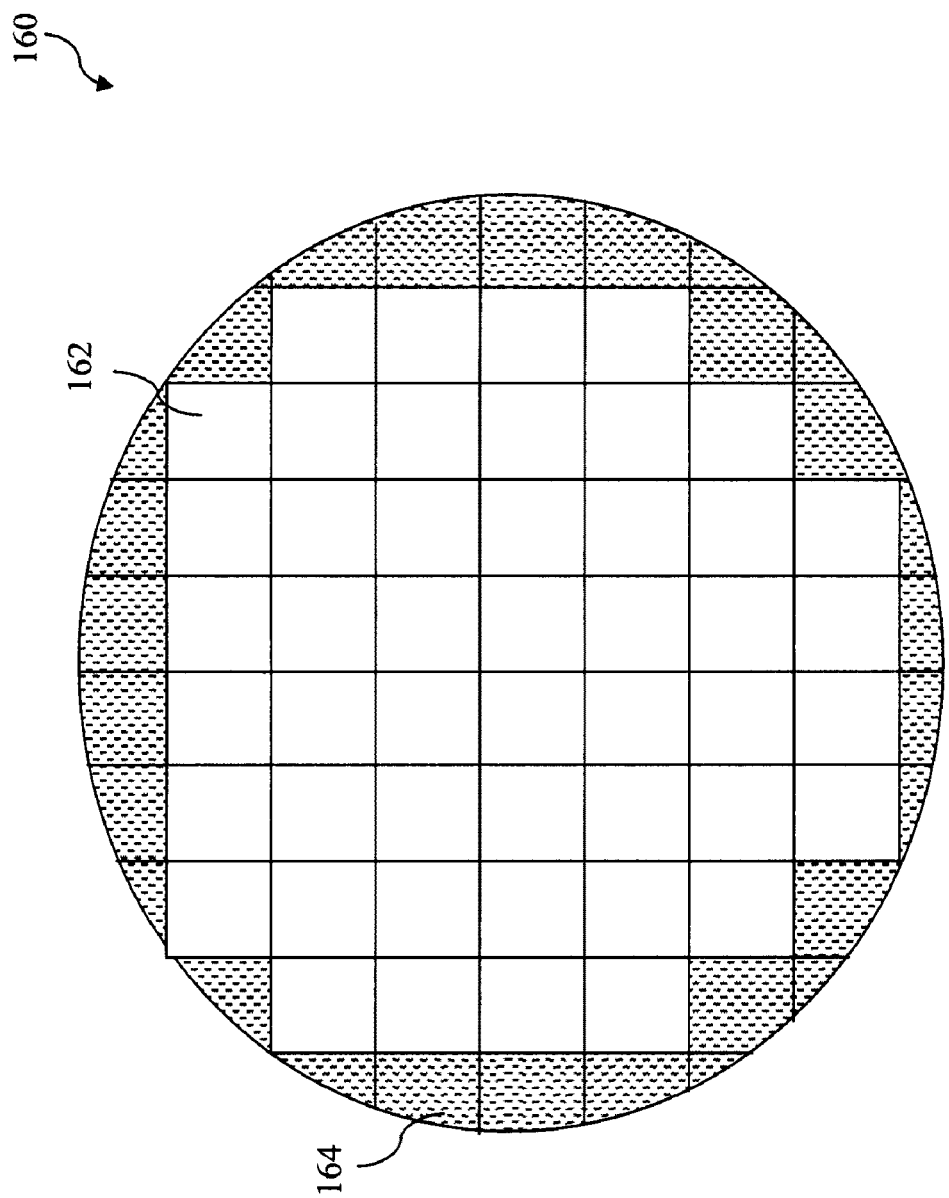
FIG. 2 illustrates a top view of one embodiment of a semiconductor wafer to be processed in the lithography system of FIG. 1.

FIG. 2 illustrates the exemplary semiconductor wafer substrate 160. The substrate 160 includes a plurality of areas, referred to as fields. One field may include a plurality of die. During a full production lithography process, the wafer is exposed one field at a time. The substrate 160 includes a plurality of major fields 162 having complete IC circuits defined therein for one or more dies. The semiconductor substrate 160 further includes a plurality of partial fields 164 disposed on wafer edge areas. The partial fields 164 may not have complete circuit patterns (limited by wafer geometry) and therefore will be scrapped if no functional IC dies exist.

Referring now to FIG. 3, the reference numeral 200 represents an exemplary mask that can be used as the mask 130 in the lithography system 100 of FIG. 1. The mask 200 includes four similar images 202 that represent a single layer to be imaged onto a field of the substrate. The single layer may be an active area (OD), polysilicon, metal 1, or contact layer. The four images 202 are separated by relatively narrow scribe streets 204. It is understood that the quantity of images (4) is being used as an example. Also, each image can actually represent any number of die.

Referring to FIG. 4, the reference numeral 210 represents another exemplary mask that can be used as the mask 130 in the lithography system 100 of FIG. 1. The mask 210 is a MLM, and includes four different images 212, 214, 216, 218 that represent four different layers to be imaged, respectively. Each of the four different images 212, 214, 216, 218 are used to expose a subset of a field. For example, a field may include eight die and each image 212, 214, 216, 218 covers two die. The four images 212, 214, 216, 218 are separated by relatively wide image spacers 220. The image spacer 220 is part of a standard MLM, and its width is used to block radiation, thereby facilitating the exposure of only one of the four images 212, 214, 216, 218 at a time. As with the mask 200, it is understood that the quantity of images (4) is being used as an example. In some embodiments, a blocking mask can be included with the mask 210, the blocking mask being used to mask out three of the four images on the mask to facilitate the projection of just a single image onto the substrate 160.

Figure 5:
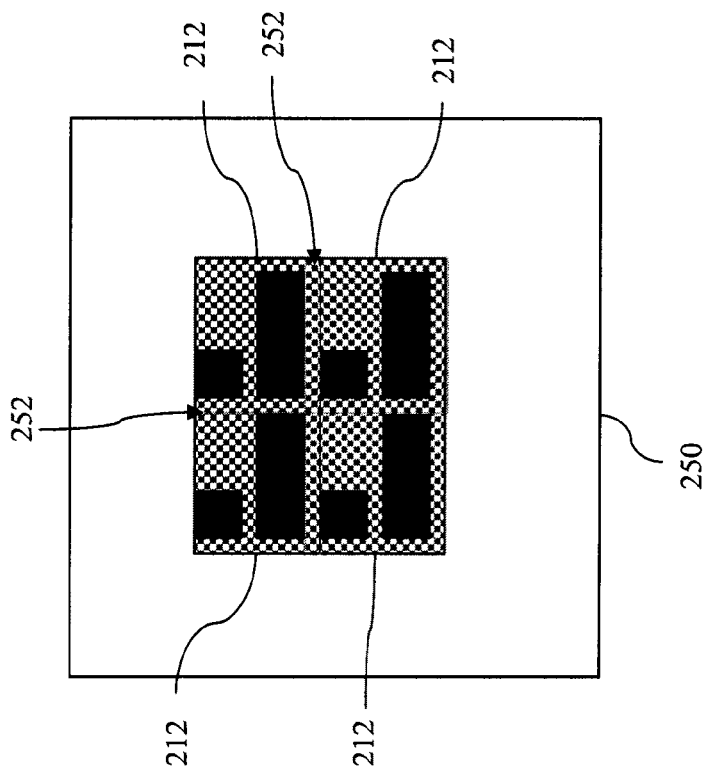

Referring to FIG. 5, the reference numeral 250 also represents an exemplary mask that can be used as the mask 130 in the lithography system 100 of FIG. 1. The mask 250 includes four similar images 212 that represent a single layer to be imaged onto a field of the substrate, as shown in the mask 220 of FIG. 4. The four images 212 are separated by relatively narrow scribe streets 252. As with the mask 200, it is understood that the quantity of images (4) is being used as an example. Also, each image can actually represent any number of die.

Figure 6:
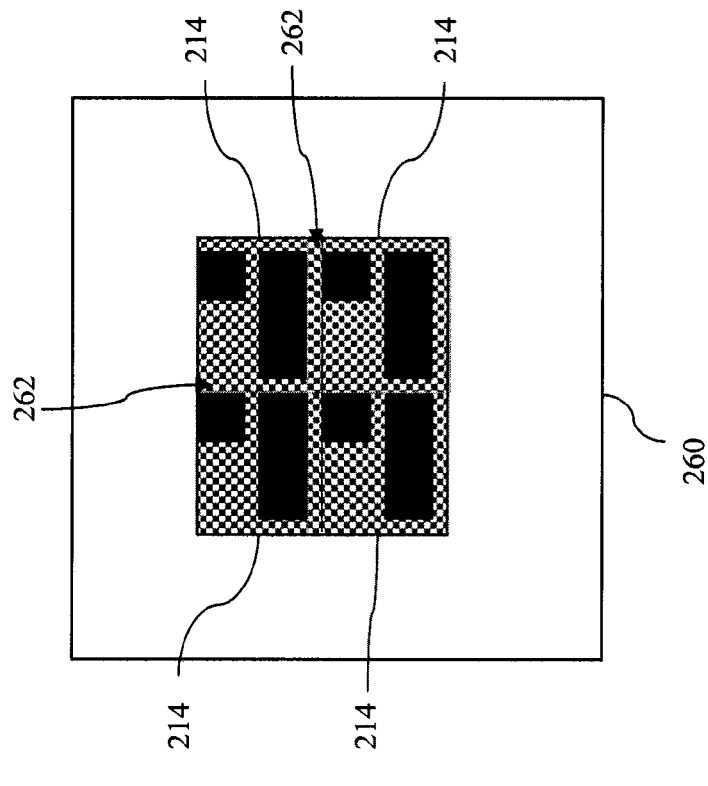

Referring to FIG. 6, the reference numeral 260 also represents an exemplary mask that can be used as the mask 130 in the lithography system 100 of FIG. 1. The mask 260 includes four similar images 214 that represent a single layer to be imaged onto a field of the substrate, as shown in the mask 220 of FIG. 4. The four images 214 are separated by a relatively narrow scribe street 262. As with the mask 200, it is understood that the quantity of images (4) is being used as an example. Also, each image can actually represent any number of die.

Although not shown, an additional mask can be provided with four similar images 216; and another additional mask can be provided with four similar images 218. Both of these additional masks would include relatively narrow scribe streets to separate their associated images.

Figure 7:
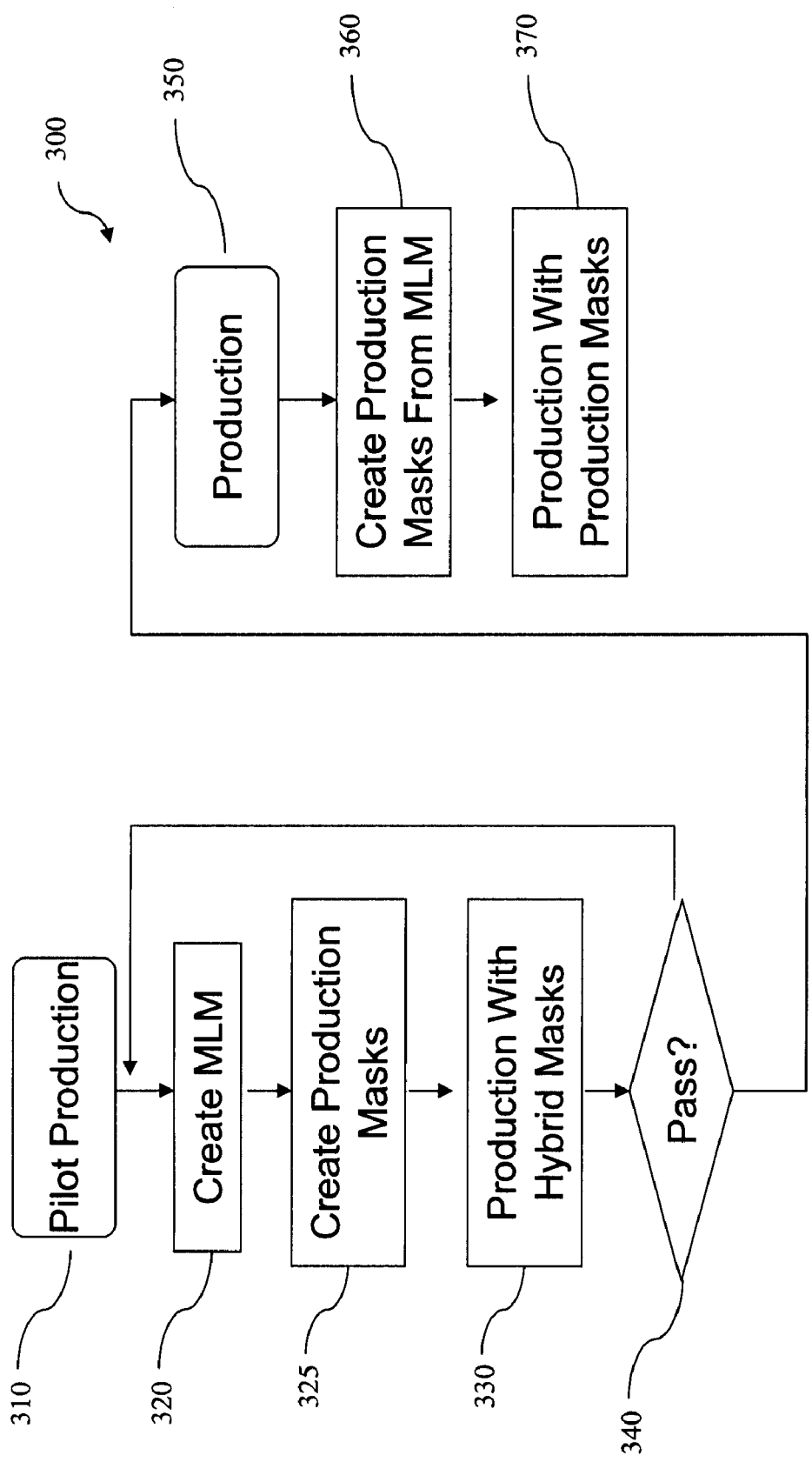
FIG. 7 is a flow chart of a method to be implemented using the lithography system of FIG. 1 and the masks of FIGS. 3-6 according to one or more embodiments of the present invention.

Referring now to FIG. 7, the reference numeral 300 designates an exemplary method by which an integrated circuit would proceed from a pilot production to a full scale production. Pilot production 310 refers to a process by which the integrated circuit design and the corresponding masks used to implement the design can be tested and verified. At step 320, one or more multi-layer masks (MLMs) are produced, such as the MLM 210 of FIG. 4. The MLMs have the benefit of reduced costs because a single mask will have images for multiple, different layers. Because masks are relatively expensive, using the MLM results in significant cost savings. As discussed above with reference to FIG. 4, a MLM has a relatively large image spacer that separates the various mask images.

In conventional MLM pilot production, several masks, such as those for active region, polysilicon, metal 1, and/or contact layers, would have multiple images of the same layer, spaced at the same dimension as the MLM 210 of FIG. 4. The wide spacing of the image spacer would be used to project a single image from these wafers. However, at step 325, instead of making these wide-spaced masks, production-ready masks, such as the mask 200 of FIG. 3, would be created. The benefit of such a mask is that upon completion of the pilot production, these masks can then be used for full production, without the requirement of purchasing and building new masks for these layers.

At step 330, pilot production is performed with the one or more MLMs and the one or more production-ready masks. This is referred to as mixed-mode or hybrid mask production. When a MLM is being used in pilot production, a single image is properly aligned to the substrate 160 (FIG. 1), and the single image is then exposed onto a sub-field of the substrate. This process is repeated until the image has been formed on the entire wafer surface, as shown in FIG. 2. When a production-ready mask is being used, the production-ready mask is fully exposed onto a field of the substrate 160. In the example of FIG. 3, this would mean aligning and exposing all four images 202 onto the substrate at a single time.

At step 340, a determination is made as to whether the pilot production has been successful. If one or more mask changes are required, execution returns to step 320 or 325 where the new mask(s) are created and pilot production can be repeated with the new mask(s). If the pilot production has been successful ("passed"), execution proceeds to full production 350. At step 360, the mask layers that were previously provided only on MLMs will now be produced onto separate production-ready masks. The production-ready masks that were used in the pilot production can be re-used for the full production. Once a complete set of production-ready masks are produced, at step 370 normal, full production can proceed with the masks.

Figure 8:
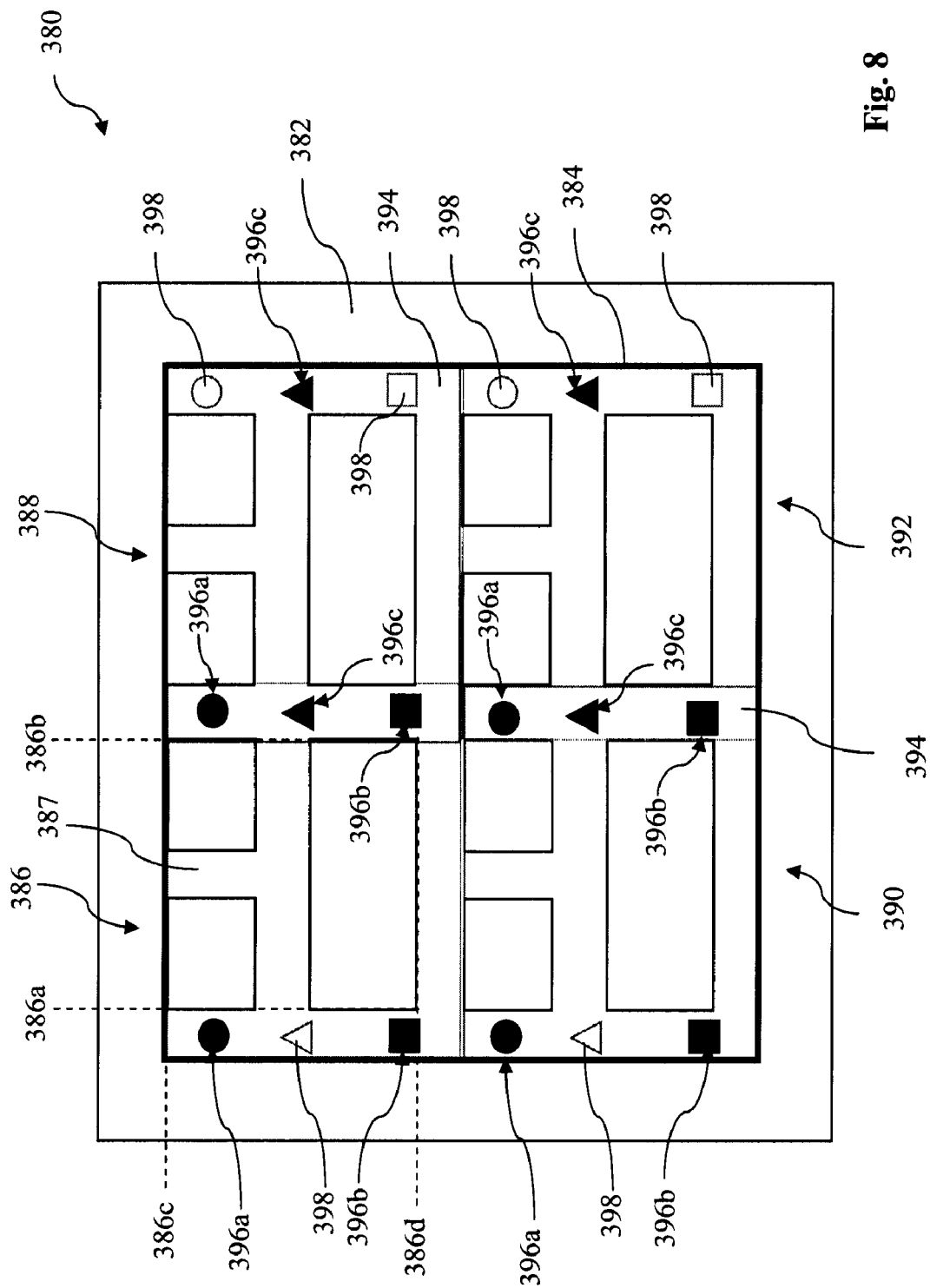
FIG. 8 illustrates one hybrid mask that can be used by the lithography system of FIG. 1 according to one embodiment of the present invention.

FIG. 8 illustrates one hybrid mask 380 that can be used by the lithography system of FIG. 1 according to one embodiment of the present invention. The hybrid mask 380 as a production-ready mask, such as the mask 200 of FIG. 3, is further described with reference to FIG. 8 according to one embodiment of the present disclosure. The hybrid mask 380 includes substrate 382 defining a reticle-field region 384. The images in the reticle-field region are to be projected to a wafer in an optical filed at the same time by a lithography system. The reticle-field region 384 includes two or more sub-field regions separated by scribe street. In this particular example, the reticle-field region 384 includes four sub-field regions 386, 388, 390 and 392. For example, the sub-field region 386 is a region defined by the broken lines 386a, 386b, 386c and 386d. The sub-field regions are separated by the scribe street 394. A same image 387 is formed in each of the sub-field regions, as illustrated in FIG. 8. In this exemplary image (only for illustration), the image includes two squares and one rectangular. A set of alignment marks 396, such as marks 396a, 396b and 396c, is formed in the scribe street and around the first sub-field region 386. The set of alignment marks 396 is reproduced in the scribe street and around another sub-field regions. The set of alignment marks 396 is repeated in the scribe street and around each of the rest sub-field regions of the reticle-field region 384 in the same configuration relative to the associated sub-field region. The scribe street also includes space areas 398. The space areas are not allowed to form any alignment mask for alignment purpose.

Thus, one embodiment of the present invention provides a method for fabricating integrated circuit devices comprising a plurality of layers. The method includes a pilot production for which a first group of one or more multi-layer masks (MLMs) are provided. The MLMs are for a first subset of the plurality of layers, each MLM including a plurality of different images for different layers. A first group of one or more production-ready masks are also provided for the pilot production. The production-ready masks are for a second subset of the plurality of layers, each production-ready mask including a plurality of similar images. The pilot production is performed using a combination of the MLMs and the production-ready masks. After the pilot production, a second group of one or more production-ready masks is produced for the first subset of the plurality of layers. The integrated circuit devices can then be fabricated using the first and second groups of production-ready masks.

Another embodiment of the present invention provides a hybrid mask set for exposing a plurality of layers on a semiconductor substrate to create an integrated circuit device. The hybrid mask set includes a group of one or more multi-layer masks (MLMs) for a first subset of the plurality of layers. Each MLM includes a plurality of different images for different layers, the images being separated by a relatively wide image spacer. The hybrid mask set also includes a group of one or more production-ready masks for a second subset of the plurality of layers. Each production-ready mask includes a plurality of similar images for a common layer, each image being separated by a relatively narrow scribe street.

Another embodiment of the present invention provides a hybrid mask for patterning a semiconductor substrate to create an integrated circuit device. The hybrid mask includes a substrate; a reticle field region defined in the substrate, wherein the reticle field region includes multiple sub-field regions separated by scribe street; a layout pattern formed on the substrate and repeated in each of the multiple sub-field regions; and a set of alignment marks formed in the scribe street and repeated around each of the multiple sub-field regions. In the disclosed hybrid mask, the multiple sub-field regions may include 4 or 6 sub-field regions in various examples.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A hybrid mask set for exposing a plurality of layers on a semiconductor substrate to create an integrated circuit device, the hybrid mask set comprising:
    a first subset of one or more multi-layer masks (MLMs) for a first group of the plurality of layers, each MLM including a plurality of different images for different layers, the different images for different layers being separated by an image spacer having a first width;
    a second subset of one or more masks for a second group of the plurality of layers, each mask including a plurality of similar images for a common layer, each image being separated by a scribe street having a second width narrower than the first width;
    wherein, the integrated circuit is created using the first and second subsets of masks.

2. The hybrid mask set of claim 1, wherein the second group of the plurality layers includes one or more from the group consisting of active region, polysilicon, contact, or metal.

3. The hybrid mask set of claim 1,
    wherein the image spacer is designed to block radiation to at least one of the images; and wherein the subset of MLMs are configured to have each image individually exposed, and the second subset of masks are configured to have all the images simultaneously exposed.

4. The hybrid mask set of claim 1, wherein each of the different images of the MLMs includes a set of alignment marks.

5. The hybrid mask set of claim 4 wherein the alignment marks are formed in one or more scribe streets between the different images.

6. A hybrid mask set for exposing a plurality of layers on a semiconductor substrate to create an integrated circuit device, the hybrid mask set comprising:
- a first subset of one or more multi-layer masks (MLMs) for a first group of the plurality of layers, each MLM including a plurality of reticle field regions configured to have each of the reticle field regions individually exposed, the reticle field regions being separated by a spacer designed to block radiation;
- a second subset of one or more production-ready masks for a second group of the plurality of layers, each production-ready mask including a field having a plurality of similar images separated by scribe street, and configured to have the images and the scribe street simultaneously exposed to a common layer
- wherein the integrated circuit is created using the first and second subsets of masks.

7. The hybrid mask set of claim 6, wherein the field is different from each of the plurality of fields in size.

8. The hybrid mask set of claim 6, wherein
- the spacer includes a first width; and
- the scribe street includes a second width less than the first width.

9. The hybrid mask set of claim 6, wherein the plurality of reticle field regions are individually exposed to form one or more from the group consisting of active region, polysilicon, contact, or metal.

10. The hybrid mask set of claim 6, wherein the plurality of reticle field regions comprises 4 reticle field regions.

11. The hybrid mask set of claim 6, wherein the second subset of one or more production-ready masks includes one mask including
- a reticle field region defined in a substrate, wherein the reticle field region includes multiple sub-field regions separated by the scribe street;
- a layout pattern formed on the substrate and repeated in each of the multiple sub-field regions; and
- a set of alignment marks formed in the scribe street and repeated around each of the multiple sub-field regions, whereby each sub-field region has its own set of alignment marks.

12. The hybrid mask set of claim 11, wherein the multiple sub-field regions comprises 4 or 6 sub-field regions.

* * * * *